United States Patent
Kim et al.

(10) Patent No.: US 11,656,645 B2
(45) Date of Patent: May 23, 2023

(54) DC VOLTAGE REGULATORS WITH DEMAND-DRIVEN POWER MANAGEMENT

(71) Applicant: Micron Technology, Inc., Boise, ID (US)

(72) Inventors: Si Hong Kim, Boise, ID (US); Ki-Jun Nam, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/571,170

(22) Filed: Jan. 7, 2022

(65) Prior Publication Data

US 2022/0129028 A1 Apr. 28, 2022

Related U.S. Application Data

(63) Continuation of application No. 16/891,963, filed on Jun. 3, 2020, now Pat. No. 11,226,646.

(51) Int. Cl.
*G05F 1/613* (2006.01)
*G11C 11/4074* (2006.01)
(Continued)

(52) U.S. Cl.
CPC ............... *G05F 1/613* (2013.01); *G06F 1/26* (2013.01); *G11C 11/2297* (2013.01);
(Continued)

(58) Field of Classification Search
None
See application file for complete search history.

(56) References Cited

U.S. PATENT DOCUMENTS

| | | | |
|---|---|---|---|
| 6,775,198 B2 * | 8/2004 | Ishida | G11C 5/14 365/230.03 |
| 6,857,055 B2 * | 2/2005 | Jeddeloh | G06F 1/28 713/340 |

(Continued)

FOREIGN PATENT DOCUMENTS

| | | |
|---|---|---|
| EP | 3032922 A1 | 6/2016 |
| TW | I614961 B | 2/2018 |

(Continued)

OTHER PUBLICATIONS

"International Application Serial No. PCT US2021 035609, International Preliminary Report on Patentability dated Dec. 15, 2022", 6 pages.

(Continued)

*Primary Examiner* — Matthew V Nguyen
(74) *Attorney, Agent, or Firm* — Schwegman Lundberg & Woessner, P.A.

(57) ABSTRACT

An electronic device may include a main circuit including multiple sub-circuits powered by a direct-current (DC) power supply circuit. The main circuit has a main circuit current demand being a time-varying demand for a DC voltage-regulated supply current being a function of a number of the sub-circuits being active. The DC power supply circuit may include multiple DC voltage regulators to provide the main circuit with the supply current and a command decoding and power management circuit to control enablement of the voltage regulators. The command decoding and power management circuit may be configured to detect an instant value of the main circuit current demand and to selectively enable one or more of the voltage regulators based on the detected instant value.

20 Claims, 7 Drawing Sheets

(51) Int. Cl.
   *H02M 3/158* (2006.01)
   *G06F 1/26* (2006.01)
   *G11C 11/22* (2006.01)
   *H02M 1/00* (2006.01)
   *G11C 5/14* (2006.01)
   *G11C 13/00* (2006.01)
   *G11C 16/30* (2006.01)

(52) U.S. Cl.
   CPC ......... *G11C 11/4074* (2013.01); *H02M 3/158* (2013.01); *G11C 5/14* (2013.01); *G11C 13/0038* (2013.01); *G11C 16/30* (2013.01); *H02M 1/0003* (2021.05); *H02M 1/0009* (2021.05)

(56) References Cited

U.S. PATENT DOCUMENTS

| | | | |
|---|---|---|---|
| 7,609,047 B2 | 10/2009 | Ravichandran | |
| 8,400,861 B2 * | 3/2013 | Jin | G11C 5/02 365/230.03 |
| 10,983,852 B2 | 4/2021 | Spica et al. | |
| 2006/0136757 A1 | 6/2006 | Chen et al. | |
| 2008/0111534 A1 | 5/2008 | Ravichandran | |
| 2008/0303494 A1 | 12/2008 | Nakakubo | |
| 2009/0245007 A1 | 10/2009 | Kaburlasos | |
| 2016/0141015 A1 | 5/2016 | Lee et al. | |
| 2016/0181803 A1 | 6/2016 | Krishnamurthy et al. | |
| 2017/0185094 A1 | 6/2017 | Atkinson et al. | |
| 2017/0187187 A1 | 6/2017 | Amin et al. | |
| 2018/0034374 A1 | 2/2018 | Breen et al. | |
| 2019/0043538 A1 | 2/2019 | Hollis | |
| 2019/0377396 A1 * | 12/2019 | Patel | G06F 3/0653 |
| 2019/0391635 A1 | 12/2019 | Lakkis et al. | |
| 2021/0382511 A1 | 12/2021 | Kim et al. | |
| 2022/0292025 A1 * | 9/2022 | Shin | G06F 1/3206 |

FOREIGN PATENT DOCUMENTS

| | | |
|---|---|---|
| TW | 202242863 | 11/2022 |
| WO | WO-2019213031 A1 | 11/2019 |
| WO | WO-2021247804 A1 | 12/2021 |

OTHER PUBLICATIONS

"International Application Serial No. PCT/US2021/035609, International Search Report dated Sep. 27, 2021", 3 pgs.

"International Application Serial No. PCT/US2021/035609, Written Opinion dated Sep. 27, 2021", 4 pgs.

"Taiwanese Application Serial No. 110120139, First Office Action dated Oct. 25, 2021", w/o English translation, 3 pgs.

* cited by examiner

DC VOLTAGE REGULATORS WITH DEMAND-DRIVEN POWER MANAGEMENT

PRIORITY APPLICATION

This application is a continuation of U.S. application Ser. No. 16/891,963, filed Jun. 3, 2020, which is incorporated herein by reference in its entirety.

BACKGROUND

Direct-current (DC) voltage regulators are used provide voltage-regulated supply current to a circuit that requires constant DC voltages to operate properly. The bias current in a voltage regulator is important for current drivability, fast response time, and output voltage stability, but consumes extra power that increases when the demand for the supply current decreases.

In an example, multiple DC voltage regulators are used in a memory device that includes multiple memory banks. These regulators are required to accommodate the maximum current demand of the memory device that may occur, for example, in a bank interleaving mode (under which memory addresses are spread evenly across banks for fast speed). When the current demand is not at the maximum, the power consumption associated with the bias currents is wasteful and significantly impacts the power efficiency of the memory device.

BRIEF DESCRIPTION OF THE DRAWINGS

In the drawings, which are not necessarily drawn to scale, like numerals may describe similar components in different views. The drawings illustrate generally, by way of example, but not by way of limitation, various embodiments discussed in the present document.

DETAILED DESCRIPTION

Figure 1:
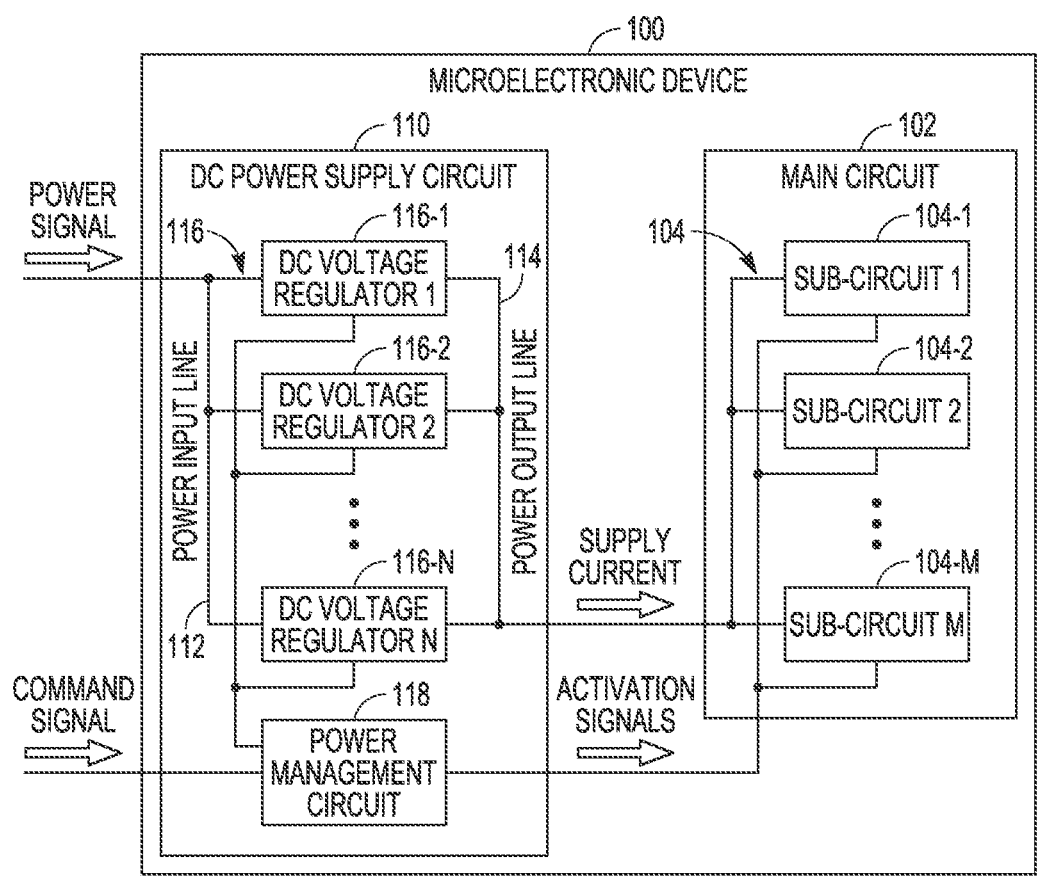
FIG. 1 is a block diagram illustrating an embodiment of a microelectronic device including a main circuit with multiple sub-circuits and a DC power supply circuit with multiple DC voltage regulators.

In the following detailed description, reference is made to the accompanying drawings which form a part hereof, and in which is shown by way of illustration specific embodiments in which the invention may be practiced. These embodiments are described in sufficient detail to enable those skilled in the art to practice the invention, and it is to be understood that the embodiments may be combined, or that other embodiments may be utilized and that structural, logical and electrical changes may be made without departing from the spirit and scope of the present invention. References to "an", "one", or "various" embodiments in this disclosure are not necessarily to the same embodiment, and such references contemplate more than one embodiment. The following detailed description provides examples, and the scope of the present invention is defined by the appended claims and their legal equivalents.

This document discusses, among other things, a system and method for supplying voltage-regulated DC electrical current using DC voltage regulators and selectively enabling the voltage regulators based on a demand for the current. The bias current of a voltage regulator increases, and hence the power efficiency of the voltage regulator decreases, when the output current (supply current) decreases. For example, in a memory device with multiple memory banks, multiple voltage regulators are used to supply voltage-regulated current to one or more active banks. Examples of such memory devices include dynamic random access memory (DRAM) devices and ferroelectric random access memory (FeRAM) devices. An "active bank" can refer to a memory bank that needs to be powered to allow for access. The number of the voltage regulators in the memory device is determined based on the maximum number of active banks (e.g., in a full bank interleaving mode). When these voltage regulators are kept on (enabled) while the number of active banks is less than the maximum, the needed supply current is a fraction of what the voltage regulators are capable of supplying. Consequently, power is lost in the voltage regulators because of the bias currents.

The present subject matter provides for improvement of power efficiency in operating DC voltage regulators, and hence power efficiency of the device in which the voltage regulators are employed, by enabling only a sufficient number of the voltage regulators to meet the instant demand for a supply current to operate the device. In the memory device, for example, the demand for the voltage-regulated current varies from time to time, depending on the number of active banks at each instant (i.e., at any point in time). The anticipated number of active banks can be used as an indicator of the demand for the voltage-regulated current to control the number of voltage regulators to be enabled at each instant. This reduces the power consumption of the voltage regulators, and hence the power consumption of the memory device, over time. The reduction is likely significant because in practice, a memory device rarely operates under a full interleaving mode.

In various embodiments, a memory device includes multiple memory banks powered through multiple voltage regulators. The number of active banks can be calculated using control commands (including addresses) and a summation logic. The calculated value can be compared to thresholds each associated with one of the multiple voltage regulators. When the calculated value reaches or exceeds each threshold, the voltage regulator associated with that threshold is enabled. For example, in one example configuration, if a memory device includes multiple memory banks powered through 4 voltage regulators, one voltage regulator is enabled when at least one memory bank is active, a second voltage regulator is enabled when at least 25% of the memory banks are active, a third voltage regulator is enabled when at least 50% the memory banks are active, and the last voltage regulator is enabled when at least 75% the memory banks are active. To ensure a sufficiently fast response to a need for increasing power, an active pulse can be transmitted to the last voltage regulator (associated with the highest threshold) to enable it, thereby preventing the increase in power (supply current) from lagging the increase in demand. For calculating the number of active banks, instead of using the bank active flag, timer signals from active and/or pre-charge commands can be used. Bank active flag is from an external command, with a duration that can be longer than tRAS (minimum time from row active command to row pre-charge command) or tRC (minimum row access cycle time). Thus, using the timer signals from active and/or pre-charge commands further reduces the power consumption of the voltage regulators, in addition to the active bank number counting.

Application of the present subject matter in a memory device is discussed in this document as a non-limiting example. The present subject matter can be applied in any circuits or systems where multiple DC voltage regulators are used to supply DC electrical current to multiple sub-circuits or sub-systems with a time-varying demand for the DC electrical current. In this document, unless noted otherwise, "substantially" includes inaccuracies resulting from practical factors such as errors within manufacturing and/or measurement tolerances.

FIG. 1 is a block diagram illustrating an embodiment of a microelectronic device 100. Microelectronic device 100 can include a main circuit 102 and a DC power supply circuit 110. Main circuit 102 can be powered by a DC voltage-regulated supply current and includes multiple sub-circuits 104. Each sub-circuit of multiple sub-circuits 104 can receive a sub-circuit activation signal and can be active or inactive according to the received sub-circuit activation signal. Main circuit 102 has a main circuit current demand being a time-varying demand for the DC voltage-regulated supply current. DC power supply circuit 110 includes a power input line 112 to receive a power signal, a power output line 114 coupled to main circuit 102, multiple DC voltage regulators 116, and a command decoding and power management circuit 118. Voltage regulators 116 can provide main circuit 102 with the DC voltage-regulated supply current through power output line 114. Voltage regulators 116 are each coupled between power input line 112 and power output line 114 and can each receive a portion of the power signal and produce a portion of the DC voltage-regulated supply current using the received portion of the power signal. Command decoding and power management circuit 118 can detect an instant value of the main circuit current demand and selectively enable one or more voltage regulators of the voltage regulators 116 based on the detected instant value.

Sub-circuits 104 as illustrated in FIG. 1 include sub-circuit 104-1, sub-circuit 104-2, ... sub-circuit 104-M, where M can be any number greater than 1. Sub-circuits 104 each have a sub-circuit current demand being a demand for a portion of the DC voltage-regulated supply current to operate when being active. The main circuit current demand is a sum of the sub-circuit current demands and has an instant value being the sum of the sub-circuit current demands of the sub-circuits being active at an instant. In various embodiments, sub-circuits 104 are substantially identical and their sub-circuit current demands are substantially identical. Thus, the main circuit current demand has a value proportional to the number of the sub-circuits being active. In other words, the number (or equivalently the percentage as the total number is known) of the sub-circuits being active can be an indicator of the main circuit current demand. The ratio of the number of active sub-circuits to the total number of the sub-circuits can represent the ratio of the instant value of the main circuit current demand to the maximum value of the main circuit current demand.

Voltage regulators 116 as illustrated in FIG. 1 include voltage regulator 116-1, voltage regulator 116-2, ... voltage regulator 116-N, where N can be any number greater than 1. In various embodiments, voltage regulators 116 are substantially identical. The number N is determined for voltage regulators 116 to be capable of satisfying the maximum value of the main circuit current demand. In various embodiments in which sub-circuits 104 are substantially identical, command decoding and power management circuit 118 can selectively enable one or more voltage regulators of voltage regulators 116 based on the number or percentage of active sub-circuits in sub-circuits 104.

Figure 2:
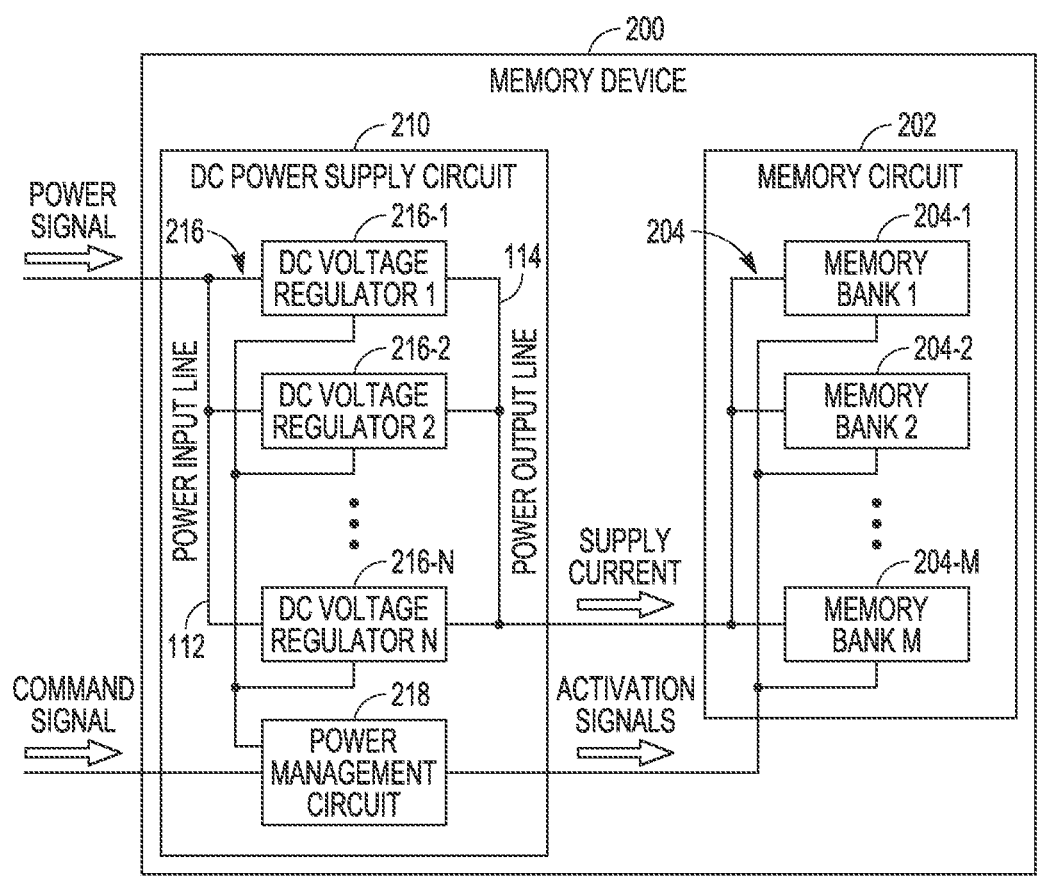
FIG. 2 is a block diagram illustrating an embodiment of a memory device including a memory circuit with multiple memory banks and a DC power supply circuit with multiple DC voltage regulators.

FIG. 2 is a block diagram illustrating an embodiment of a memory device 200, which can represent an example of microelectronic device 100. Memory device 200 can include a memory circuit 202 (which can represent an example of main circuit 102) and a DC power supply circuit 210 (which can represent an example of DC power supply circuit 110). Memory circuit 202 can be powered by a DC voltage-regulated supply current and includes multiple memory banks 204 (which can represent an example of multiple sub-circuits 104). Each bank of multiple memory banks 204 can receive a bank activation signal (which can represent an example of the sub-circuit activation signal) and can be active or inactive according to the received bank activation signal. Memory circuit 202 has a memory circuit current demand being a time-varying demand for the DC voltage-regulated supply current. DC power supply circuit 210 includes power input line 112 to receive a power signal, power output line 114 coupled to memory circuit 202, multiple DC voltage regulators 216 (which can represent an example of multiple DC voltage regulators 116), and a command decoding and power management circuit 218 (which can represent an example of command decoding and power management circuit 118). Voltage regulators 216 can provide memory circuit 202 with the DC voltage-regulated supply current through power output line 114. Voltage regulators 216 are each coupled between power input line 112 and power output line 114 and can each receive a portion of the power signal and produce a portion of the DC voltage-regulated supply current using the received portion of the power signal. Command decoding and power management circuit 218 can detect an instant value of the memory circuit current demand and selectively enable one or more voltage regulators of the voltage regulators 216 based on the detected instant value.

In various embodiments, memory device 200 can include a dynamic random access memory (DRAM) device, a ferroelectric random access memory (FeRAM) device, or any other type of memory device that includes multiple memory banks, or other independently activatable sections (arrays, planes, superblocks, blocks, etc.—all such banks or other sections are embraced within the term "sub-circuits," as used herein). The described system may thus be used, for example, in memory devices implementing other forms of either volatile and non-volatile storage technologies, including flash memory (e.g., NAND or NOR flash), electrically erasable programmable ROM (EEPROM), static RAM (SRAM), erasable programmable ROM (EPROM), resistance variable memory, such as phase-change random-access memory (PCRAM), resistive random-access memory (RRAM), magnetoresistive random-access memory (MRAM), or 3D XPoint™ memory, among others. For purposes of the present description the subject matter is described in reference to independently activatable banks of memory. DC power supply circuit 210 can represent an example of DC power supply circuit 110 that is tailored for use in memory device 200 and suitable for supplying power to memory circuit 202 for its operations.

Memory banks 204 as illustrated in FIG. 2 include memory bank 204-1, memory bank 204-2, . . . memory bank 204-M, where M can be any number greater than 1. Memory banks 204 each have a bank current demand being a demand for a portion of the DC voltage-regulated supply current to operate when being active. The memory circuit current demand is a sum of the bank current demands and has an instant value being the sum of the bank current demands of the memory banks being active at an instant. In various embodiments, memory banks 204 are substantially identical and their bank current demands are substantially identical. Thus, the memory circuit current demand has a value proportional to the number of the memory banks being active. In other words, the number (or equivalently the percentage as the total number is known) of the memory banks being active can be an indicator of the memory circuit current demand. The ratio of the number of active banks to the total number of the memory banks can represent the ratio of the instant value of the memory circuit current demand to the maximum value of the memory circuit current demand. The maximum value of the memory circuit current demand can correspond to, for example, the value of the memory circuit current demand when memory circuit 202 is operating under a full interleaving mode during which all of memory banks 204 are active. Bank activation consumes an amount of DC-regulated supply current that can be significant enough to limit the number of overlapping activations of banks to a number smaller than the total number of memory banks in a memory device. Once activated, a bank does not consume additional DC-regulated supply current to maintain its active state, so usually the maximum current demand does not occur when all the banks are active.

Voltage regulators 216 as illustrated in FIG. 2 include voltage regulator 216-1, voltage regulator 216-2, . . . voltage regulator 216-N, where N can be any number greater than 1. In various embodiments, voltage regulators 216 are substantially identical. The number N is determined for voltage regulators 216 to be capable of satisfying the maximum value of the memory circuit current demand. In various embodiments in which memory banks 204 are substantially identical, command decoding and power management circuit 218 can selectively enable one or more voltage regulators of voltage regulators 216 based on the number or percentage of active banks in memory banks 204.

Figure 3:
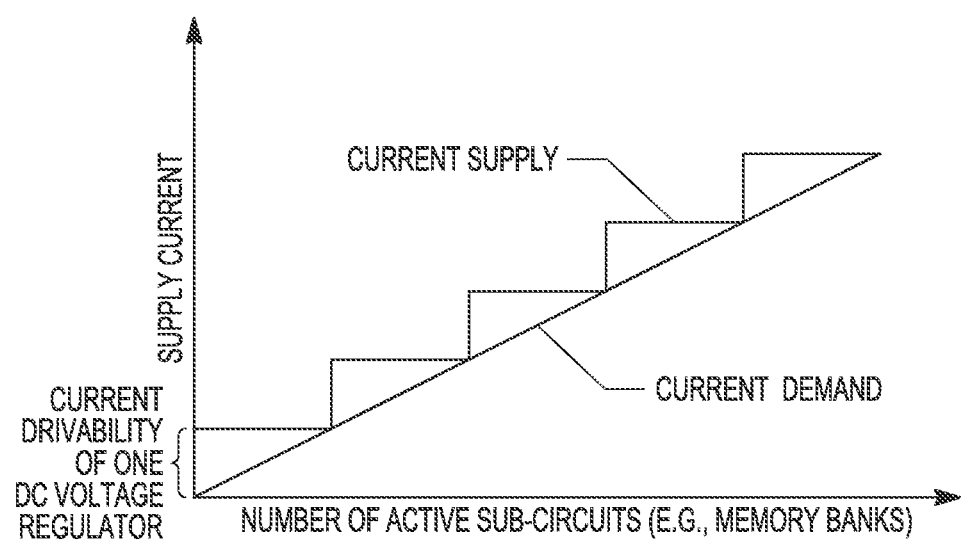
FIG. 3 is a graph illustrating an embodiment of a method for enabling DC voltage regulators based on a demand for the supply current.

FIG. 3 is a graph illustrating an embodiment of a method for enabling DC voltage regulators (such as voltage regulators 116 or 216) based on a current demand (such as the main circuit current demand in microelectronic device 100 or the memory circuit current demand in memory device 200). When multiple DC voltage regulators are used, such as illustrated in FIGS. 1 and 2, the current supply as shown in FIG. 3 is the total output of the enabled voltage regulators (such as the DC voltage-regulated supply current transmitted through power output line 114). In various embodiments in which the voltage regulators are substantially identical, the current supply increases at substantially identical increments (which is the current output capability of each voltage regulator) with the number of voltage regulators being enabled, as shown in FIG. 3. Also as shown in FIG. 3, the current supply is only required to meet the current demand. Power efficiency of the DC voltage regulators can be improved by reducing the difference between the current supply and the current demand.

Figure 4:
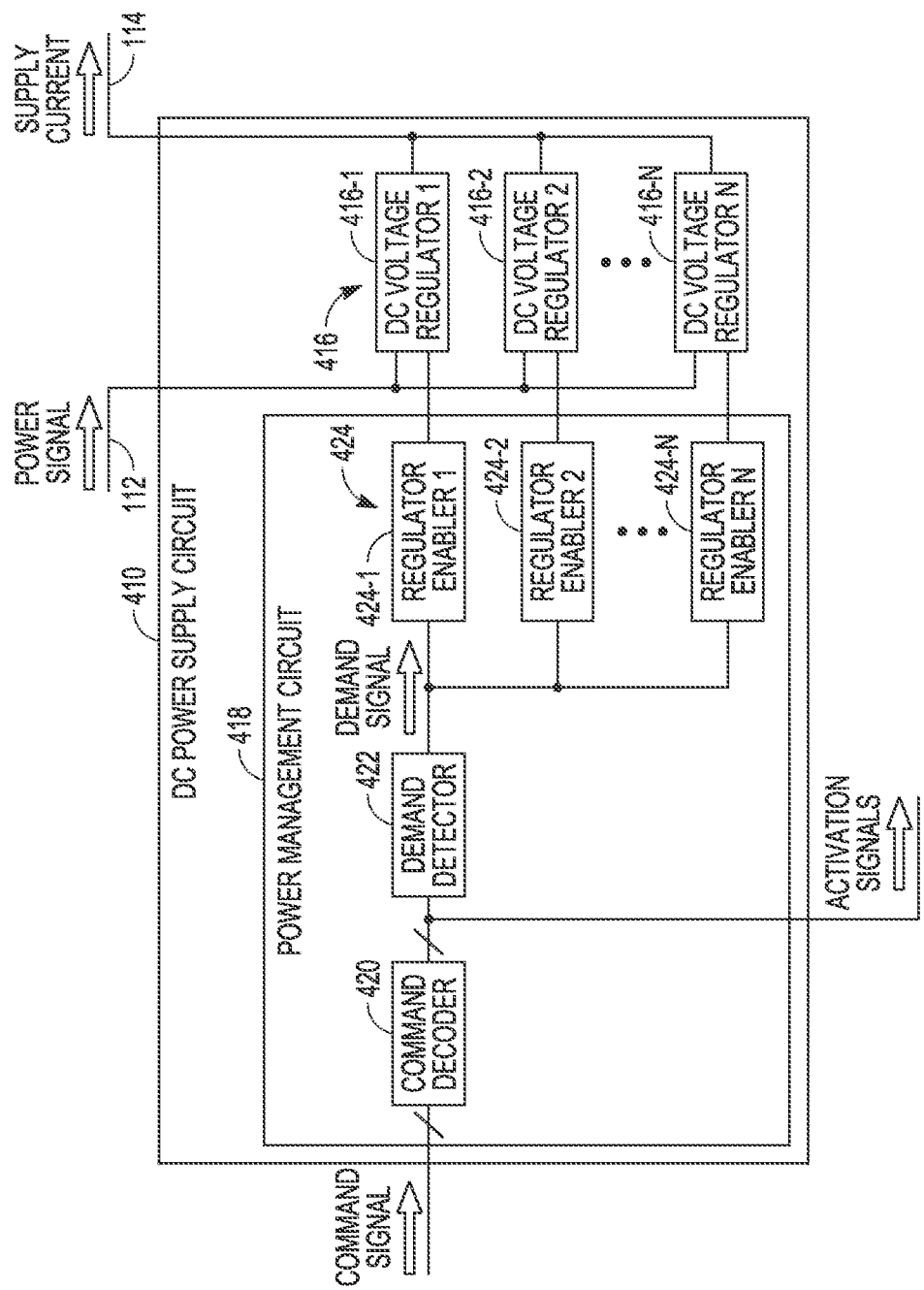
FIG. 4 is a block diagram illustrating an embodiment of a DC power supply circuit, such as the DC power supply circuit of FIG. 1 or FIG. 2.

FIG. 4 is a block diagram illustrating an embodiment of a DC power supply circuit 410, which can represent an example of DC power supply circuit 110 or 210. DC power supply circuit 410 includes power input line 112 to receive a power signal, power output line 114 to transmit a DC voltage-regulated supply current, multiple DC voltage regulators 416, and a command decoding and power management circuit 418 (which can represent an example of command decoding and power management circuit 118 or 218). Examples of multiple DC voltage regulators 416 include multiple DC voltage regulators 116 or 216, when DC power supply circuit 410 represents an example of DC power supply circuit 110 or 210, respectively.

Command decoding and power management circuit 418 can include a command decoder 420, a demand detector 422, and multiple regulator enablers 424. Command decoder 420 can receive a command signal and generate the sub-circuit activation signals each controlling whether a sub-circuit of multiple sub-circuits 104 is active or inactive by decoding the received command signal. Demand detector 422 can detect the instant value of the main circuit current demand using the sub-circuit activation signals and produce a demand signal representative of the detected instant value. Regulator enablers 424 are each coupled to one voltage regulator of the multiple DC voltage regulators 416 to enable that voltage regulator when the demand signal reaches or exceeds an enabling threshold associated with that voltage regulator. In various embodiments in which the number (or equivalently the percentage as the total number is known) of the sub-circuits being active can be an indicator of the main circuit current demand, demand detector 422 can detect the number of active sub-circuits of multiple sub-circuits 104 using the sub-circuit activation signals. The number of active sub-circuits is thus used as an indicator of the instant value of the main circuit current demand, and the demand signal representative of the number of active sub-circuits. Regulator enablers 424 are each coupled to one voltage regulator of the multiple DC voltage regulators 416 to enable that voltage regulator when the number of active sub-circuits reaches or exceeds a threshold number associated with the one voltage regulator.

In various embodiments in which DC power supply circuit 410 supplies power to memory circuit 202, command decoder 420 can receive the command signal and generate the bank activation signals each controlling whether a bank of the multiple memory banks 204 is active or inactive by decoding the received command signal. The command signal can include including commands and addresses controlling which memory banks of multiple memory banks 204 are active. The bank activation signals can M binary signals for M memory banks that correspond to an M-bit binary code with a time-varying value that changes each time when at least the activation state of one memory bank changes. In one embodiment, TRC (row cycle time) signals for used as the bank activation signals from which demand detector 422 detects the number of active banks. The TRC signals can be state signals or self-time signals and can cover tRAS, tRP, or tRC, wherein tRC (row cycle time, tRC=tRAS+tRP) is the minimum time for a row access cycle, tRAS (row address strobe time) is the minimum time from row active to row pre-charge command, and tRP (row pre-charge time) is the minimum time from row pre-charge to row active command. Demand detector 422 can detect the instant value of the memory circuit current demand using the bank activation signals and produce the demand signal representative of the detected instant value. In various embodiments in which the number (or equivalently the percentage as the total number is known) of the active banks can be an indicator of the memory circuit current demand, demand detector 422 can detect the number of active banks of multiple memory banks 204 using the bank activation signals. The number of active banks is an indicator of the instant value of the memory circuit current demand. The demand signal is representative of the number of active banks. The demand signal can be an m-bit binary code at each instant indicating the number of active banks in a total of M memory banks ($M=2^m$, e.g., a 5-bit binary code for 32 memory banks). Regulator enablers 424 are each coupled to one voltage regulator of voltage regulators 416 to enable that voltage regulator when the number of active banks reaches or exceeds a threshold number associated with that voltage regulator. Thus, regulator enabler 424-1 is coupled to voltage regulator 416-1 to enable voltage regulator 416-1 when the number of active banks reaches or exceeds the threshold number associated with voltage regulator 416-1, regulator enabler 424-2 is coupled to voltage regulator 416-2 to enable voltage regulator 416-2 when the number of active banks reaches or exceeds the threshold number associated with voltage regulator 416-2, . . . and regulator enabler 424-N is coupled to voltage regulator 416-N to enable voltage regulator 416-N when the number of active banks reaches or exceeds the threshold number associated with voltage regulator 416-N.

Figure 5:
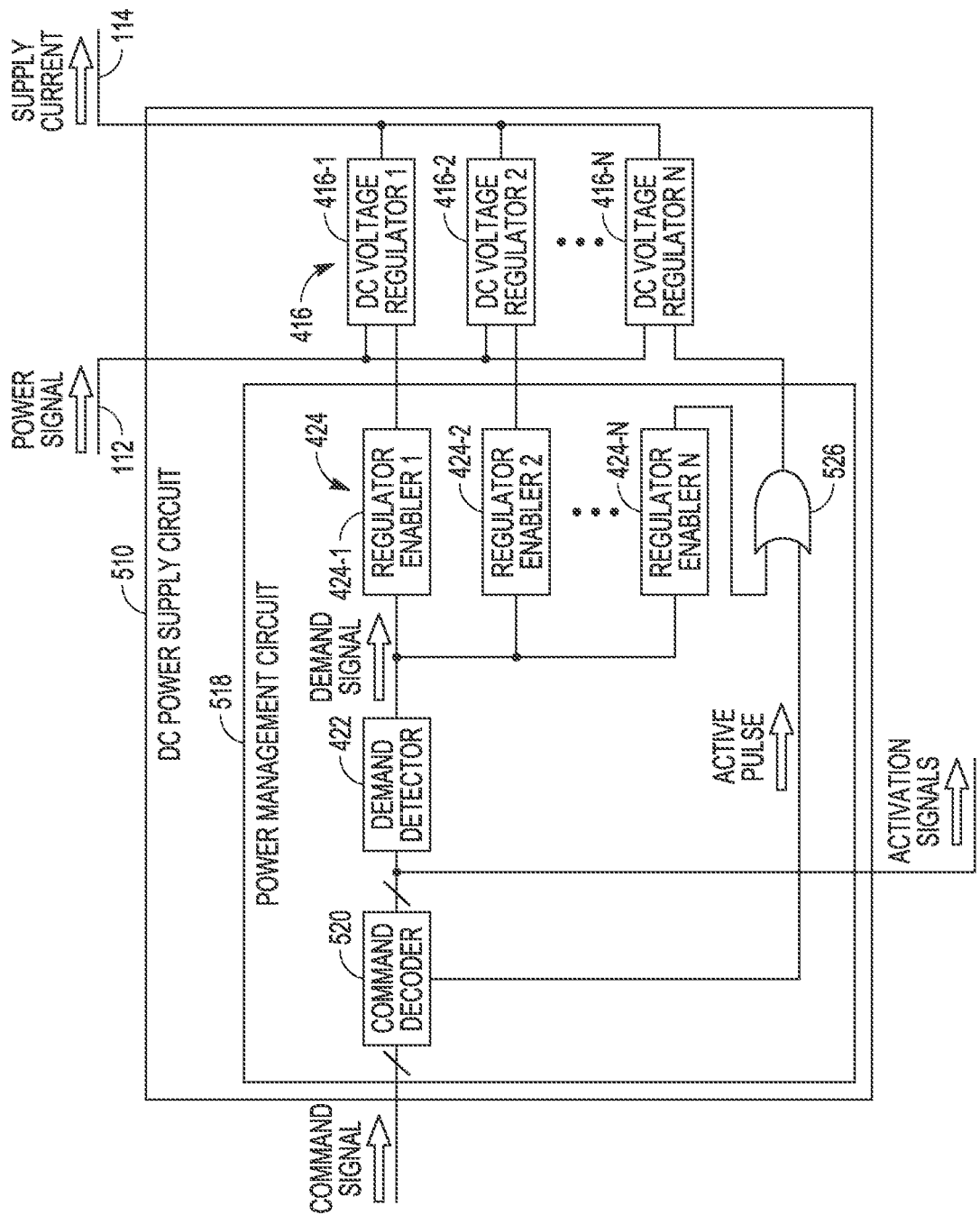
FIG. 5 is a block diagram illustrating another embodiment of a DC power supply circuit, such as the DC power supply circuit of FIG. 1 or FIG. 2.

FIG. 5 is a block diagram illustrating an embodiment of a DC power supply circuit 510, which can represent another example of DC power supply circuit of 110 or 210. DC power supply circuit 510 includes power input line 112 to receive a power signal, power output line 114 to transmit a DC voltage-regulated supply current, multiple DC voltage regulators 416, and a command decoding and power management circuit 518 (which can represent another example of command decoding and power management circuit 118 or 218). DC power supply circuit 510 can be identical to DC power supply circuit 410 except for that command decoding and power management circuit 518 includes a command decoder 520 that can produce an active pulse when the decoded command signal indicates an approaching increase in the main circuit current demand and an OR gate 526 that can allow either an enabling signal from regulator enabler 424-N or the active pulse to enable voltage regulator 416-N.

In various embodiments, the active pulse can enable a voltage regulator of voltage regulators 416 directly by bypassing multiple regulator enablers 424 to compensate for a delay between an increase in the main circuit current demand and the enablement of an additional voltage regulator of voltage regulators 416. The delay can be caused by signal processing delays in demand detector 422 and regulator enablers 424. In the illustrated embodiment, the active pulse enables voltage regulator 416-N, which is the last voltage regulator of voltage regulators 416. The "last" voltage regulator refers the voltage regulator coupled to the "last" regulator enabler being the regulator enabler having the highest enabling threshold (i.e., regulator enabler 424-N). Voltage regulator 416-N is enabled by the enabling signal from regulator enabler 424-N and/or the active pulse from command decoder 520.

In various embodiments in which DC power supply circuit supplies power to memory circuit 202, command decoder 520 can produce the active pulse when the decoded command signal indicates an approaching increase in the memory circuit current demand. The active pulse can enable a voltage regulator of voltage regulators 416 directly by bypassing multiple regulator enablers 424 to compensate for a delay between an increase in the memory circuit current demand and an additional voltage regulator of the voltage regulators 416 being enabled. In the illustrated embodiment, the active pulse enables voltage regulator 415-N, which is the last voltage regulator of voltage regulators 416. The "last" voltage regulator refers the voltage regulator coupled to the "last" regulator enabler being the regulator enabler having the highest threshold number (i.e., regulator enabler 424-N). Voltage regulator 416-N is enabled by at least one of the enabling signal from regulator enabler 424-N or the active pulse from command decoder 520.

Figure 6:
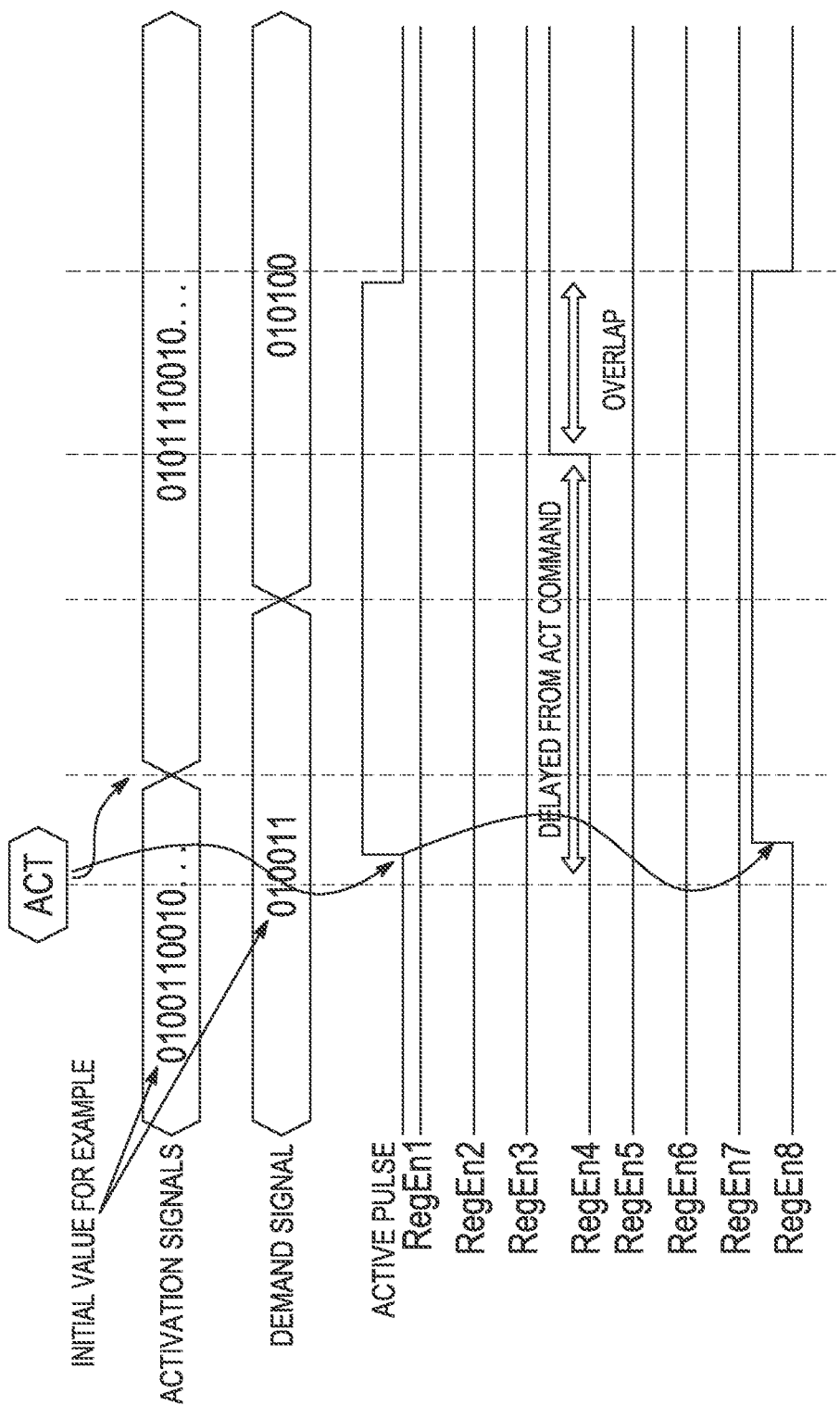
FIG. 6 is a timing diagram illustrating an embodiment of a method used in the DC power supply circuit of FIG. 5 for providing a fast response to an anticipated change in the demand for the supply current when needed.

FIG. 6 is a timing diagram illustrating an embodiment of a method used in DC power supply circuit 510 for providing a fast response to an anticipated change in the memory circuit current demand when needed. The time diagram shows the reason for using the active pulse in an example of memory circuit 202 with 32 memory banks 204 (i.e., M=32) powered using an example of DC power supply circuit 510 with 8 voltage regulators 416 (i.e., N=8). The bank activation signals correspond to a 32-bit binary code each corresponding to one of the 32 memory banks. The demand signal corresponds to a 5-bit binary code whose value represents the number of active banks among the 32 memory banks. FIG. 6 shows an example of timing relationships among the activation signals, the demand signal, the active pulse, and the enabling signals (RegEn1, RegEn2, . . . RegEn8) each produced by one of the 8 regulator enablers for enabling the corresponding voltage regulator of the 8 voltage regulators. The illustrated example shows 3 voltage regulators are enabled initially. Then, an additional memory bank is to be activated, which requires another voltage regulator to be enabled. However, there is a time delay before the change in the activation signals triggers the change in the demand signal, and there is another time delay before the change in the demand signal triggers the change in the enabling signal for enabling the $4^{th}$ voltage regulator. These delays in sum can be longer than the activation of the additional memory bank in response to the change in the activation signals. The active pulse is therefore introduced to ensure that the $4^{th}$ voltage regulator is enabled before the additional memory bank becomes active (as indicated by the "OVERLAP" in FIG. 6). In other words, the active pulse can prevent the increase in supply current from DC power supply circuit 510 from lagging the increase in the memory circuit current demand that requires enabling another voltage regulator.

Figure 7:
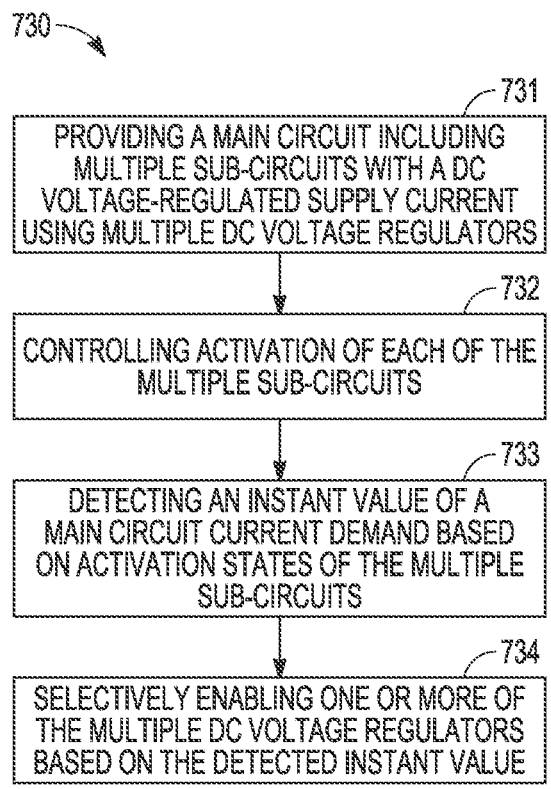
FIG. 7 is a flow chart illustrating an embodiment of a method for enabling DC voltage regulators based on a demand for a DC voltage-regulated supply current.

FIG. 7 is a flow chart illustrating an embodiment of a method 730 for enabling DC voltage regulators based on a demand for a DC voltage-regulated supply current. Method 730 can be performed for power management in a microelectronic device including a main circuit having multiple sub-circuits, such as microelectronic device 100. An example of the microelectronic device includes a memory device having a memory circuit having multiple memory banks, such as memory device 200. In various embodiments when the microelectronic device includes the memory device, the main circuit is the memory circuit, and the multiple sub-circuits are each a memory bank.

At 731, the main circuit is provided with the DC voltage-regulated supply current using multiple DC voltage regulators. The voltage regulators each receive a power signal and produced a portion of the DC voltage-regulated supply current using the received power signal.

At 732, activation of each sub-circuit of multiple sub-circuits is controlled, such as by using a sub-circuit activation signal. The sub-circuit activation signal can be produced by decoding a command signal controlling operations of the sub-circuits.

At 733, an instant value of a main circuit current demand is detected based on activation states of the multiple sub-circuits, such as being detected from the sub-circuit activation signals. The main circuit current demand is the demand of the main circuit for the DC voltage-regulated circuit. In various embodiments in which the sub-circuits are substantially identical, an instant number (or equivalently an instant percentage as the total number is known) of the sub-circuits being active can be detected as the instant value of the main circuit current demand.

At 734, one or more voltage regulators of the multiple DC voltage regulators are enabled based on the detected instant value of the main circuit current demand. In various embodiments in which the sub-circuits are substantially identical, each voltage regulator of the multiple voltage regulators is enabled when the detected instant number reaches or exceeds a threshold number associated with that voltage regulator. In one embodiment, an active pulse is produced when the decoded command signal indicates an increase in the main circuit current demand, and one of the multiple voltage regulators is enabled using the active pulse. The voltage regulator to be enabled by the active pulse can be the voltage regulator associated with the highest enabling threshold (e.g., the highest threshold number). The active pulse is used to prevent the increase in supply current from lagging the increase in the main circuit current demand due to signal processing delays.

Some non-limiting examples (Examples 1-20) of the present subject matter are provided as follows:

In Example 1, a microelectronic device may include a main circuit and a DC power supply circuit. The main circuit may be configured to be powered by a direct-current (DC) voltage-regulated supply current and include multiple sub-circuits. The multiple sub-circuits may each be configured to receive a sub-circuit activation signal and to be active or inactive according to the received sub-circuit activation signal. The main circuit has a main circuit current demand being a time-varying demand for the supply current being a function of a number of the sub-circuits being active. The DC power supply circuit may include a power input line configured to receive a power signal, a power output line coupled to the main circuit, multiple DC voltage regulators, and a command decoding and power management circuit. The multiple DC voltage regulators may be configured to provide the main circuit with the DC voltage-regulated supply current through the power output line. Each of the voltage regulators may be coupled between the power input line and the power output line and configured to receive a portion of the power signal and to produce a portion of the DC voltage-regulated supply current using the received portion of the power signal. The command decoding and power management circuit may be configured to detect an instant value of the main circuit current demand and to selectively enable one or more voltage regulators of the multiple DC voltage regulators based on the detected instant value.

In Example 2, the subject matter of Example 1 may optionally be configured such that the command decoding and power management circuit is configured to detect an instant number of the sub-circuits being active as the instant value of the main circuit current demand and to selectively enable one or more voltage regulators of the multiple DC voltage regulators based on the detected instant number.

In Example 3, the subject matter of any one or any combination of Examples 1 and 2 may optionally be configured such that the command decoding and power management circuit includes a command decoder configured to receive a command signal and to generate the sub-circuit activation signals by decoding the received command signal, a demand detector configured to detect the instant value of the main circuit current demand using the sub-circuit activation signals and to produce a demand signal representative of the detected instant value, and multiple regulator enablers each coupled to one voltage regulator of the multiple DC voltage regulators to enable the one voltage regulator when the demand signal reaches or exceeds an enabling threshold associated with the one voltage regulator.

In Example 4, the subject matter of Example 3 may optionally be configured such that the demand detector is configured to detect an instant number of active sub-circuits of the multiple sub-circuit using the sub-circuit activation signals and to produce the demand signal as an indicator of the instant number of active sub-circuits. The instant number of active sub-circuits is an indicator of the instant value of the main circuit current demand.

In Example 5, the subject matter of Example 4 may optionally be configured such that the multiple regulator enablers are each configured to enable the one voltage regulator when the detected instant number of active sub-circuits reaches or exceeds a threshold number associated with the one voltage regulator.

In Example 6, the subject matter of any one or any combination of Examples 3 to 5 may optionally be configured such that the command decoder is configured to produce an active pulse when the decoded command signal indicates an increase in the main circuit current demand, and a voltage regulator of the multiple voltage regulators is further configured to be enabled by the active pulse.

In Example 7, the subject matter of Example 6 may optionally be configured such that the voltage regulator is further configured to be enabled by the active pulse is coupled to a last regulator enabler of the multiple regulator enablers being the regulator enabler having the highest enabling threshold.

In Example 8, the subject matter of any one or any combination of Examples 1 to 7 may optionally be configured to include a memory device that includes the main circuit and the DC power supply circuit. The main circuit is a memory circuit including multiple memory banks each being a sub-circuits of the multiple sub-circuits.

In Example 9, a memory device may include a memory circuit and a DC power supply circuit. The memory circuit may be configured to be powered by a direct-current (DC) voltage-regulated supply current and include multiple memory banks. The multiple memory banks may be configured to receive a bank activation signal and to be active or inactive according to the received bank activation signal. The DC power supply circuit may include a power input line configured to receive a power signal, a power output line coupled to the memory circuit, multiple DC voltage regulators, and a command decoding and power management circuit. The multiple DC voltage regulators may be configured to provide the memory circuit with the DC voltage-regulated supply current through the power output line. Each of the voltage regulators may be coupled between the power input line and the power output line and configured to receive a portion of the power signal and to produce a portion of the DC voltage-regulated supply current using the received portion of the power signal. The command decoding and power management circuit may be configured to detect an instant number of active banks of the multiple memory banks and to selectively enable one or more voltage regulators of the multiple DC voltage regulators based on the detected instant number.

In Example 10, the subject matter of Example 9 may optionally be configured such that the memory device is a dynamic random access memory (DRAM) device.

In Example 11, the subject matter of Example 9 may optionally be configured such that the memory device is a ferroelectric random access memory (FeRAM) device.

In Example 12, the subject matter of any one or any combination of Examples 9 to 11 may optionally be configured such that the command decoding and power management circuit includes a command decoder configured to receive a command signal and to generate the bank activation signals by decoding the received command signal, a demand detector configured to detect the instant number of active banks using the bank activation signals and to produce a demand signal representative of the detected instant number, and multiple regulator enablers each coupled to one voltage regulator of the multiple DC voltage regulators to enable the one voltage regulator when the detected instant number reaches or exceeds a threshold number associated with the one voltage regulator.

In Example 13, the subject matter of Example 12 may optionally be configured such that the command decoder is configured to generate the bank activation signals using at least one of a minimum time between two consecutive row active commands, a minimum time from a row active command to a subsequently adjacent row pre-charge command, or a minimum time from a row pre-charge command to a subsequently adjacent row active command.

In Example 14, the subject matter of any one or any combination of Examples 12 and 13 may optionally be configured such that the command decoder is configured to produce an active pulse when the decoded command signal indicates an increase in the memory circuit current demand, and a last voltage regulator of the multiple voltage regulators is further configured to be enabled by the active pulse, the last voltage regulator coupled to a last regulator enabler of the multiple regulator enablers being the regulator enabler having the highest threshold number.

In Example 15, a method for power management in a microelectronic device including a main circuit having multiple sub-circuits is provided. The method may include providing the main circuit with a direct-current (DC) voltage-regulated supply current using multiple DC voltage regulators each receiving a portion of a power signal and producing a portion of the DC voltage-regulated supply current using the received portion of the power signal, controlling activation of each sub-circuit of the multiple sub-circuits, detecting an instant value of a main circuit current demand based on activation states of the multiple sub-circuits, and selectively enabling one or more voltage regulators of the multiple DC voltage regulators based on the detected instant value. The main circuit current demand is a demand of the main circuit for the DC voltage-regulated current.

In Example 16, the subject matter of detecting the instant value of the main circuit current demand as found in Example 15 may optionally include detecting an instant number of the sub-circuits being active, and the subject matter of selectively enabling the one or more voltage regulators as found in Example 15 may optionally include enabling each voltage regulator of the multiple voltage regulators when the detected instant number reaches or exceeds a threshold number associated with the each voltage regulator.

In Example 17, the subject matter of Example 16 may optionally further include receiving a command signal and generating sub-circuit activation signals by decoding the received command signal, and the subject matter of controlling the activation of each sub-circuit of the multiple sub-circuits as found in Example 16 may optionally include controlling the activation of each sub-circuit of the multiple sub-circuits using a sub-circuit activation signal, and the subject matter of detecting the instant number of the sub-circuits being active as found in Example 16 may optionally include detecting the instant number of the sub-circuits being active using the sub-circuit activation signals.

In Example 18, the subject matter of providing the main circuit with the DC voltage-regulated supply current as found in any one or any combination of Examples 15 to 17 may optionally include providing a memory circuit of a memory device with the DC voltage-regulated supply current, and the subject matter of controlling activation of each sub-circuit of multiple sub-circuits as found in any one or any combination of Examples 15 to 17 may optionally include controlling activation of each bank of multiple memory banks of the memory circuit.

In Example 19, the subject matter of Example 18 may optionally further include producing an active pulse when the decoded command signal indicates an increase in the main circuit current demand and enabling a voltage regulator of the multiple voltage regulators using the active pulse.

In Example 20, the subject matter of enabling the voltage regulator of the multiple voltage regulators using the active pulse as found in Example 19 may optionally include enabling the voltage regulator associated with the highest threshold number.

The above detailed description includes references to the accompanying drawings, which form a part of the detailed description. The drawings show, by way of illustration, specific embodiments in which the invention can be practiced. These embodiments are also referred to herein as "examples". Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

It will be understood that when an element is referred to as being "on," "connected to" or "coupled with" another element, it can be directly on, connected, or coupled with the other element or intervening elements may be present. In contrast, when an element is referred to as being "directly on," "directly connected to" or "directly coupled with" another element, there are no intervening elements or layers present. If two elements are shown in the drawings with a line connecting them, the two elements can be either be coupled, or directly coupled, unless otherwise indicated.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

What is claimed is:

1. A method for managing power supply in a memory device including multiple memory banks, the method comprising:
   providing the multiple memory banks with a direct-current (DC) voltage-regulated supply current;
   receiving bank activation signals each controlling an activation state of a memory bank of the multiple memory banks;
   determining an instant value of a demand for the supply current using the received bank activation signals; and
   controlling an amount of the supply current provided to the multiple memory banks based on the determined instant value.

2. The method of claim 1, comprising:
   using multiple DC voltage regulators to provide the supply current; and
   enabling one or more DC voltage regulators of the multiple DC voltage regulators based on the determined instant value.

3. The method of claim 2, wherein determining the instant value of the demand for the supply current comprises determining an instant number of active memory banks of the multiple memory banks.

4. The method of claim 3, wherein enabling the one or more DC voltage regulators comprises enabling each DC voltage regulator of the multiple DC voltage regulators in response to the determined instant number reaching or exceeding a threshold number.

5. The method of claim 4, wherein enabling the one or more DC voltage regulators comprises enabling each DC voltage regulator of the multiple DC voltage regulators in response to the determined instant number reaching or exceeding a threshold number associated with the each DC voltage regulator.

6. The method of claim 1, further comprising:
   receiving a command signal;
   generating the bank activation signals by decoding the received command signal; and
   controlling activation of each memory bank of the multiple memory banks using a bank activating signal of the generated bank activation signals.

7. The method of claim 6, further comprising:
   producing an active pulse in response an increase in the demand for the supply current being indicated by the received command signal; and
   enabling an additional DC voltage regulator of the multiple DC voltage regulators using the active pulse.

8. A memory device, comprising:
   a memory circuit configured to be powered by a direct-current (DC) voltage-regulated supply current and including multiple memory banks configured to receive bank activation signals each controlling an activation state of a respective memory bank of the multiple memory banks; and
   a DC power supply circuit configured to provide the memory circuit with the supply current, to determine an instant value of a demand for the supply current using the bank activation signals, and to control an amount of the supply current to be provided to the multiple memory banks based on the determined instant value.

9. The memory device of claim 8, wherein the DC power supply circuit comprises:
   multiple DC voltage regulators each configured to provide a portion of the supply current; and
   a power management circuit configured to determine the instant value of the demand for the supply current and to enable one or more DC voltage regulators of the multiple DC voltage regulators based on the determined instant value.

10. The memory device of claim 9, wherein the power management circuit comprises a command decoder configured to receiving a command signal and to generate the bank activation signals by decoding the received command signal.

11. The memory device of claim 10, wherein the power management circuit comprises multiple regulator enablers each coupled to a DC voltage regulator of the multiple DC voltage regulators and configured to enable the DC voltage regulator in response to the determined instant value reaching or exceeding an enabling threshold associated with the DC voltage regulator.

12. The memory device of claim 11, wherein the power management circuit is configured to determine an instant number of active memory banks of the multiple memory banks as the instant value of the demand for the supply current, and to control a number of DC voltage regulators of the multiple DC voltage regulators to be enabled based on the determined instant number.

13. The memory device of claim 11, wherein the power management circuit is configured to produce an active pulse in response to an increase of the demand for the supply current being indicated by the decoded command signal, and a DC voltage regulator of the multiple DC voltage regulators is further configured to be enabled by the active pulse.

14. The memory device of claim 8, where the memory device comprises a dynamic random access memory (DRAM) device.

15. The memory device of claim 8, where the memory device comprises a ferroelectric random access memory (FeRAM) device.

16. A memory device, comprising:
   multiple memory banks each configured to receive a bank activation signal and to be active or inactive according to the received bank activation signal; and
   a power supply circuit configured receive a power signal and a command signal and to provide the multiple memory banks with a direct-current (DC) voltage-regulated supply current, the command signal controlling an activation of each memory bank of the multiple memory banks, the power supply circuit comprises:
      multiple DC voltage regulators each configured to receive a portion of the power signal and to provide a portion of the DC voltage-regulated supply current using the received portion of the power signal; and
      a power management circuit configured to determine an instant number of active banks of the multiple memory banks using the command signal and to enable one or more DC voltage regulators of the multiple DC voltage regulators based on the determined instant number.

17. The memory device of claim 16, where the memory device is a dynamic random access memory (DRAM) device.

18. The memory device of claim 16, where the memory device is a ferroelectric random access memory (FeRAM) device.

19. The memory device of claim 16, wherein the power management circuit comprises multiple regulator enablers each coupled to a DC voltage regulator of the multiple DC voltage regulators and configured to enable the DC voltage regulator when the determined instant number reaches or exceeds a threshold number associated with the one voltage regulator.

20. The memory device of claim 19, wherein the power management circuit is configured to produce an active pulse in response to an increase in the instant number of active memory banks being indicated by the command signal, and a DC voltage regulator of the multiple DC voltage regulators is further configured to be enabled by the active pulse.

* * * * *